(12) United States Patent
Yoo

(10) Patent No.: US 6,740,895 B2
(45) Date of Patent: May 25, 2004

(54) METHOD AND APPARATUS FOR EMISSION LITHOGRAPHY USING PATTERNED EMITTER

(75) Inventor: In-Kyeong Yoo, Yongin (KR)

(73) Assignees: Samsung Electronics Co., Ltd., Kyungki-do (KR); Virginia Tech Intellectual Properties, Inc., Blacksburg, VA (US)

( * ) Notice: Subject to any disclaimer, the term of this patent is extended or adjusted under 35 U.S.C. 154(b) by 316 days.

(21) Appl. No.: 09/865,607

(22) Filed: May 29, 2001

(65) Prior Publication Data

US 2002/0012860 A1 Jan. 31, 2002

Related U.S. Application Data

(63) Continuation of application No. 09/619,526, filed on Jul. 19, 2000, now Pat. No. 6,476,402.

(51) Int. Cl.[7] .................................................. H01J 37/00
(52) U.S. Cl. ................... 250/492.24; 250/492.2
(58) Field of Search ........................ 250/492.24, 492.2; 430/30, 296

(56) References Cited

U.S. PATENT DOCUMENTS

| | | | | | |
|---|---|---|---|---|---|
| 3,745,358 A | * | 7/1973 | Firtz et al. | ............. | 250/492.24 |
| 4,634,874 A | * | 1/1987 | Ward | ........................ | 250/492.2 |
| 5,395,738 A | * | 3/1995 | Brandes et al. | ............. | 430/296 |
| 5,424,549 A | * | 6/1995 | Feldman | ................ | 250/492.24 |
| 5,729,583 A | | 3/1998 | Tang et al. | ................. | 378/122 |
| 5,981,962 A | * | 11/1999 | Groves et al. | ......... | 250/492.23 |
| 6,429,443 B1 | * | 8/2002 | Mankos et al. | ........ | 250/492.24 |

* cited by examiner

*Primary Examiner*—Kiet T. Nguyen
(74) *Attorney, Agent, or Firm*—Lee & Sterba, P.C.

(57) ABSTRACT

A method and apparatus for emission lithography using a patterned emitter wherein, in the apparatus for emission lithography, a pyroelectric emitter or a ferroelectric emitter is patterned using a mask and it is then heated. Upon heating, electrons are not emitted from that part of the emitter covered by the mask, but are emitted from the exposed part of the emitter not covered by the mask so that the shape of the emitter pattern is projected onto the substrate. To prevent dispersion of emitted electron beams, which are desired to be parallel, the electron beams are controlled using a magnet, a direct current magnetic field generator or a deflection system, thereby achieving an exact one-to-one projection or an exact x-to-one projection of the desired pattern etched on the substrate.

14 Claims, 3 Drawing Sheets

METHOD AND APPARATUS FOR EMISSION LITHOGRAPHY USING PATTERNED EMITTER

This application is a continuation-in-part application of U.S. patent application Ser. No. 09/619,526, filed on Jul. 19, 2000 now U.S. Pat. No. 6,476,402, which is incorporated by reference herein in its entirety.

BACKGROUND OF THE INVENTION

1. Field of the Invention

The present invention relates to a method and apparatus for emission lithography using a patterned emitter.

2. Description of the Related Art

An apparatus for performing ferroelectric switching lithography, which uses a patterned emitter, emits electrons by switching a patterned ferroelectric emitter to expose an electron resist on a substrate to form a desired pattern which is the same as that of the emitter. Ferroelectric switching emission is disadvantageous in that the electrode formed on the emitter by a mask absorbs electrons. Moreover, the emitter cannot reliably emit electrons when it is not connected to the electrode.

SUMMARY OF THE INVENTION

To solve the above problem, a feature of an embodiment of the present invention includes an apparatus for and method of emission lithography using a patterned emitter, in which a pyroelectric emitter or a ferroelectric emitter emits electrons when heated in a vacuum by infrared rays, a laser, or a heater. The emitter is patterned by a mask so that electrons emitted from the emitter expose an electron resist on a substrate to form a pattern which is the same as that of the emitter.

An apparatus for emission lithography according to an embodiment of the present invention comprises a plate type emitter separated from a substrate holder by a predetermined distance, the plate type emitter having a desired pattern on its surface facing the substrate holder and being formed of a pyroelectric or ferroelectric material; a heating source for heating the plate type emitter; and magnets or DC magnetic field generators disposed outside the emitter and the substrate holder, for controlling the path of electrons emitted from the plate type emitter.

Preferably, the heating source is a remote controlled heater which generates infrared rays or a laser, or a contact heating plate which uses resistance heating. The heating source is formed to heat the emitter to a phase transition temperature or higher.

There is also provided a method of providing a one-to-one projection of emission lithography comprising exposing a substrate to an emitter having a desired pattern on its surface facing a substrate holder; applying a voltage between the emitter and the substrate to allow electrons to be emitted along a path from the emitter and applied to the substrate; controlling the path of electrons using magnets or DC magnetic field generators disposed outside the emitter and the substrate holder; and heating the emitter.

Further, there is also provided an apparatus for an x-to-one projection of emission lithography, which comprises a plate type emitter separated from a substrate holder by a predetermined distance, the plate type emitter having a desired pattern on its surface facing the substrate holder and being formed of a pyroelectric or ferroelectric material; a heating source for heating the plate type emitter; and a deflection system disposed between the emitter and the substrate holder, for controlling the path of electrons emitted from the plate type emitter.

Preferably, the heating source is a remote controlled heater that generates infrared rays or a laser, or a contact heating plate which uses resistance heating. The heating source generates sufficient heat to heat the emitter to a phase transition temperature or higher. The deflection system includes deflectors for deflecting electrons emitted from the emitter; a magnetic lens disposed between the deflectors where the magnetic lens focuses the emitted electrons; and a diaphragm having an aperture for passing electrons focused by the magnetic lens and filtering out electrons drifting away from the focused electrons.

In addition, there is provided a method of providing an x-to-one projection of emission lithography comprising exposing a substrate to an emitter having a desired pattern on its surface facing a substrate holder; applying a voltage between the emitter and the substrate to allow electrons to be emitted along a path from the emitter and applied to the substrate; controlling the path of electrons emitted from an emitter structure toward an object to be etched, using a deflection system; and heating the emitter.

The invention, though, is pointed out with particularity by the appended claims.

BRIEF DESCRIPTION OF THE DRAWINGS

The above features and advantages of the present invention will become more apparent upon review of the illustrative embodiments thereof with reference to the accompanying drawings in which.

DESCRIPTION OF ILLUSTRATIVE EMBODIMENTS

In an apparatus for performing emission lithography using a patterned emitter according to an embodiment of the present invention, a pyroelectric emitter or a ferroelectric emitter is patterned using a mask and is then heated so that electrons are not emitted from that part of the emitter covered by the mask, but are emitted from the exposed part of the emitter not covered by the mask so that the shape of the emitter pattern is projected onto a substrate. Since electron beams emitted at this time may not be parallel to the path between the emitter and object, but instead may be dispersed, blurring of the image pattern of the emitter may occur. To reduce blurring, the electron beams are controlled using a magnet or a direct current (DC) magnetic field generator. The emitter is preferably heated to a phase transition temperature or higher in order to provide a sufficient electron dose.

Figure 1:
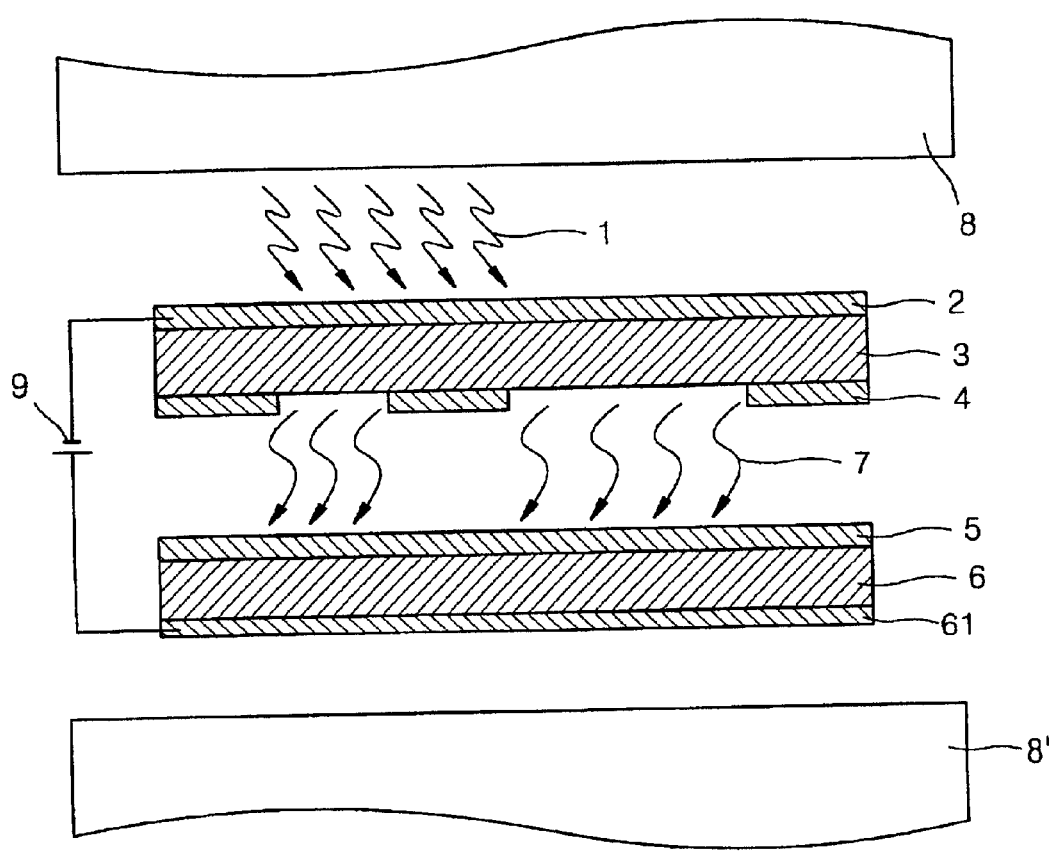
FIG. 1 is a schematic sectional view of an apparatus for emission lithography using a patterned emitter for achieving one-to-one projection of a pattern according to the present invention.

As described above, an apparatus for emission lithography according to the present invention heats a ferroelectric or pyroelectric emitter, as opposed to switching a ferroelectric emitter to emit electrons. As shown in FIG. 1, an emitter 3 formed of a pyroelectric or ferroelectric material emits electrons when it is heated in a vacuum by a heating source 1, such as infrared rays, laser or a heater. The emitter 3 is previously patterned so that electrons are not emitted from the part of the emitter screened by mask 4, but are emitted from the exposed part of the emitter not covered by mask 4. Accordingly, the pattern of the emitter is projected on substrate 6. Since electron beams 7 may not be parallel but dispersed, blurring the imaged pattern may occur. To reduce blurring, the electron beams 7 are controlled using a magnet or a DC magnetic field generator (an apparatus such as an electromagnet or a coil for generating a DC magnetic field). Also, the emitter 3 is preferably heated to a phase transition temperature Tp or higher in order to provide sufficient electron dose.

In a one-to-one projection system, an emitter structure which comprises the emitter 3 mounted on an emitter mount 2 and the mask 4, and an object to be etched in which the substrate 6 stably fixed on a substrate holder 61 is coated with an electron resist 5, are disposed between permanent magnets or DC magnetic field generators 8 and 8'. Voltage source 9 is applied between the substrate 6 and the emitter 3 (voltage source 9 is applied to the emitter 3 and the substrate 6 through the emitter mount 2 and the substrate holder 61). To project electrons onto the substrate 6, the substrate 6 operates as an anode. The emitter 3 is heated remotely by the infrared rays or laser 1 or directly by a heating plate (which can be realized by the emitter mount 2) using electrical resistance heating, which comes in contact with the emitter 3. The heating plate, for example, may be coated with a tantalum (Ta) film or a metal oxide film.

Figure 2:
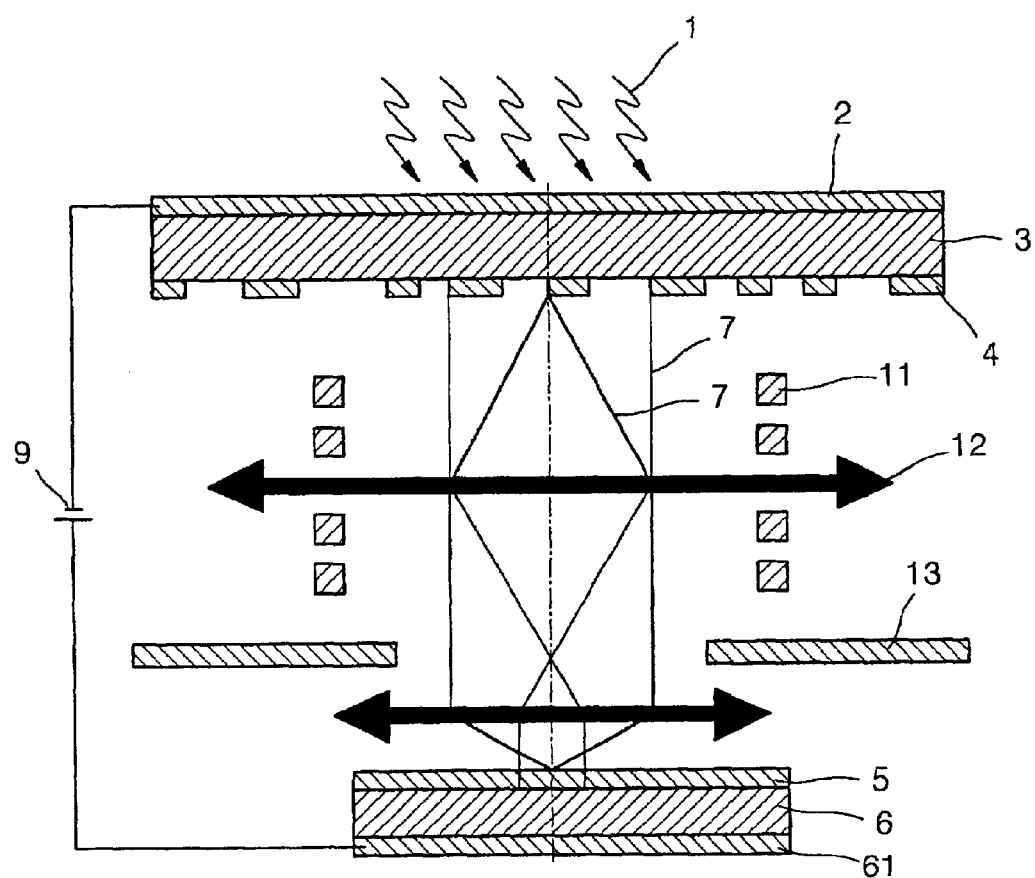
FIG. 2 is a schematic sectional view of an apparatus for emission lithography using a patterned emitter for x-to-one projection according to the present invention.

In an x-to-one deflection system as depicted in FIG. 2, deflectors 11, a magnetic lens 12, and a diaphragm 13 are disposed in front of the emitter structure, which comprises the emitter 3 mounted on the emitter mount 2 and the mask 4, to refract electron beams and form a pattern having a reduced size on the substrate 6. The voltage source 9 is applied between the substrate holder 61 and the emitter mount 2.

The following description sets forth the principle of operation of emission lithography using the structure described above. When the emitter structure with the patterned mask 4 is heated in a vacuum, electron beams 7 are emitted from those parts of the emitter 3 which is not covered with the mask 4. At this time, the voltage source 9 is applied between the emitter 3 and the substrate 6, thereby forming an electric field. Then, the electron beams 7 are directed toward the substrate 6. The motion of electrons can be represented by a vector component which is parallel to the direction of the electric field and a vector component which is perpendicular (i.e., orthogonal) to the direction of the electric field.

As shown in FIG. 1, when an external magnetic field is applied parallel to the electric field, electrons within the electric field and the magnetic field move in a spiral direction. In other words, an electron motion vector parallel to the magnetic field results in electron motion parallel to the magnetic field, and an electron motion vector perpendicular to the electric field results in circular (harmonic) electron motion. The parallel motion and the circular motion, when combined, result in spiral motion 7. Accordingly, the spiral motion has a cycle. When the substrate 6 is separated from the emitter by a distance corresponding to a multiple of half or one wavelength of the cycle of the spiral motion, the pattern of the emitter 3 is exactly projected to the substrate 6 in a one-to-one ratio. This is the principle of one-to-one projection. Generally, an exact pattern is obtained by adjusting the voltage (electric field) and fixing the magnetic field and distance between the emitter and the substrate that carries the object to be etched.

A method of providing a one-to-one projection of emission lithography comprises exposing the substrate 6 to the emitter 3 having a desired pattern on its surface facing the substrate holder 61; applying a voltage between the emitter 3 and the substrate 6 to allow electrons to be emitted along a path from the emitter 3 to the substrate 6; controlling the path of electrons using magnets or DC magnetic field generators 8 and 8' disposed outside the emitter 3 and the substrate holder 61; and heating the emitter 3. The heating step may include heating the emitter 3 by at least one of infrared rays, laser, and an electrical resistance heater. The heating step may also include heating the emitter 3 near to a phase transition temperature or to a higher temperature.

As shown in FIG. 2, in an x-to-one projection, the deflectors 11 and the magnetic lens 12 are disposed in front of the emitter structure to focus dispersed electron beams and to reduce the size of the emitter pattern. The diaphragm 13 having an aperture is employed for clearly projecting the emitter pattern to the substrate 6. Because a small area rather than a large area is generally needed in order to reduce the size of the image of the emitter pattern formed on the substrate 6, the emitter structure is partially heated. Alternatively, the entire emitter pattern is projected onto the substrate 6 while the size of the image of the emitter pattern is reduced even when the entire emitter structure is heated.

Figure 3:
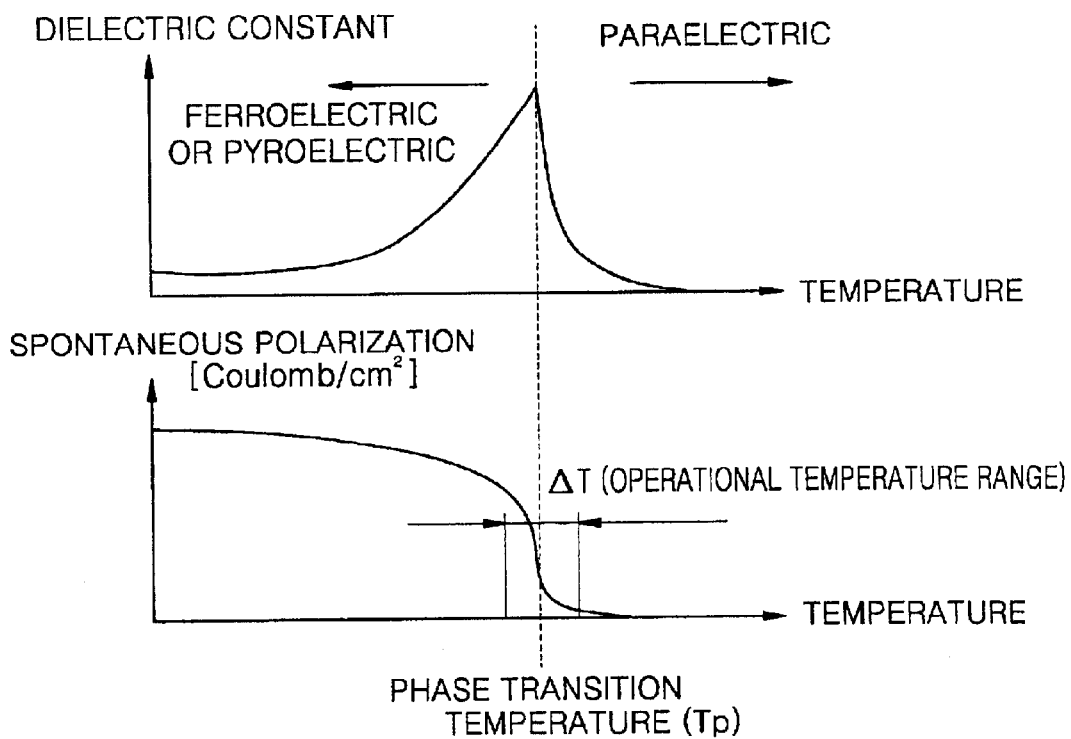
FIG. 3 is a graph showing typical phase transition of a pyroelectric material and a ferroelectric material about at a phase transition temperature.

The emitter structure is preferably heated near to its phase transition temperature Tp or to a higher temperature to obtain a sufficient electron dose. To repeat the projection, heating and cooling are repeated. In this case, to achieve high production throughput, the emitter structure is preferably cooled to a temperature slightly below the phase transition temperature Tp and heated to a temperature slightly above the phase transition temperature Tp, as shown in FIG. 3. This is because the amount of electrons emitted from an emitter is proportional to the rate of spontaneous polarization, which varies between the lowest operational temperature to the phase transition temperature. For the lowest operational temperature, room temperature may be considered as the limit. This however, is not necessary because phase transition may be completed at a substantially higher temperature than the room temperature.

A method of providing an x-to-one projection of emission lithography, comprises exposing the substrate 6 to the emitter 3 having a desired pattern on its surface facing the substrate holder 61; applying a voltage between the emitter 3 and the substrate 6 to allow electrons to be emitted along a path from the emitter 3 to the substrate 6; controlling the path of electrons from the emitter structure to the object to be etched using a deflection system; and heating the emitter 3. The heating step may include heating the emitter 3 by at least one of infrared rays, laser, and an electrical resistance heater. In addition, heating may include heating the emitter 3 near to the phase transition temperature or higher. The controlling step may include deflecting emitted electrons from the emitter 3, focusing the emitted electrons using the magnetic lens 12, and after the focusing step, passing the emitted electrons through the diaphragm 13 to filter out electrons drifting away from a focal path of electrons.

As described above, in an apparatus or method for implementing emission lithography using a patterned emitter, a pyroelectric emitter or a ferroelectric emitter is patterned using a mask. Upon heating the emitter, electrons are not emitted from that part of the emitter covered by the mask, but are emitted from the exposed part of the emitter that is not covered by the mask so that the shape of the emitter pattern is projected onto a substrate which carries the object to be etched. To prevent dispersion of emitted electron beams, which are desired to be parallel to the path between the emitter and the object being etched, the electron beams may be controlled using a magnet, a DC magnetic field generator or a deflection system, thereby achieving a one-to-one or an x-to-one projection.

EXAMPLE

A 30 μm width pattern was obtained under a DC magnetic field of 0.27 Tesla and a 4 kV DC bias at a distance of 2.5 mm. A $BaTiO_3$ emitter was heated by an n+Si heating pad by applying DC current through the n+Si pad. Four (4) kV was applied between the collector (electron resist) and the heating pad. The emitter, collector, heating pad and the thermocouple were put inside a vacuum tube for the test and the vacuum level was maintained lower than $2 \times 10^{-5}$ torr. An electromagnet was set up outside the vacuum tube to obtain a DC magnetic field.

While the above embodiments are illustrative, it will become apparent from the teachings herein that alternative embodiments may be constructed without departing from the spirit of the invention. Accordingly, it is the intent to embrace all such embodiments as may come to those skilled in the art to which the subject matter of the present invention pertains.

What is claimed is:

1. An apparatus for providing a one-to-one projection of emission lithography, comprising:
    a plate type emitter separated from a substrate holder by a predetermined distance, the plate type emitter having a desired pattern on its surface facing the substrate holder and being formed of a material selected from the group consisting of pyroelectric and ferroelectric material;
    a heating source for heating the plate type emitter; and
    a plurality of magnets or DC magnetic field generators disposed outside the emitter and the substrate holder, for controlling the path of electrons emitted from the plate type emitter.

2. The apparatus of claim 1, wherein the heating source is a remote controlled heater which generates infrared rays or a laser, or a contact heating plate which uses electrical resistance heating.

3. The apparatus of claim 1, wherein the heating source heats the emitter to a phase transition temperature or higher.

4. An apparatus for an x-to-one projection of emission lithography, comprising:
    a plate type emitter separated from a substrate holder by a predetermined distance, the plate type emitter having a desired pattern on its surface facing the substrate holder and being formed of a material selected from the group consisting of pyroelectric and ferroelectric material;
    a heating source for heating the plate type emitter; and
    a deflection system disposed between the emitter and the substrate holder, for controlling the path of electrons emitted from the plate type emitter.

5. The apparatus of claim 4, wherein the heating source is a remote controlled heater which generates infrared rays or a laser, or a contact heating plate which uses electrical resistance heating.

6. The apparatus of claim 4, wherein the heating source heats the emitter to a phase transition temperature or higher.

7. The apparatus of claim 4, wherein the deflection system comprises:
    a plurality of deflectors for deflecting electrons emitted from the emitter;
    a magnetic lens disposed between the plurality of deflectors, the magnetic lens focusing the emitted electrons; and
    a diaphragm for passing electrons focused by the magnetic lens and filtering out electrons drifting away from the focused electrons.

8. A method of providing a one-to-one projection of emission lithography, comprising:
    forming a plate type emitter of either a pyroelectric or ferroelectric material;
    exposing a substrate to the emitter having a desired pattern on its surface facing a substrate holder;
    applying a voltage between the emitter and the substrate to allow electrons to be emitted along a path from the emitter and applied to the substrate;
    controlling the path of electrons using a plurality of magnets or DC magnetic field generators disposed outside the emitter and the substrate holder; and
    heating the emitter.

9. The method as recited in claim 8, wherein the heating step includes heating the emitter by at least one of infrared rays, a laser, and an electrical resistance heater.

10. The method as recited in claim 8, wherein the heating step includes heating the emitter near to a phase transition temperature or higher.

11. A method of providing an x-to-one projection of emission lithography, comprising:
    forming a plate type emitter of either a pyroelectric or ferroelectric material;
    exposing a substrate to the emitter having a desired pattern on its surface facing a substrate holder;
    applying a voltage between the emitter and the substrate to allow electrons to be emitted along a path from the emitter and applied to the substrate;
    controlling the path of electrons emitted from an emitter structure toward an object to be etched, using a deflection system; and
    heating the emitter.

12. The method as recited in claim 11, wherein the heating step includes heating the emitter by at least one of infrared rays, a laser, and an electrical resistance heater.

13. The method as recited in claim 11, wherein the heating step includes heating the emitter near to a phase transition temperature or higher.

14. The method as recited in claim 11, wherein the controlling step includes deflecting emitted electrons from the emitter, focusing the emitted electrons using a magnetic lens, and after the focusing step, passing the emitted electrons through a diaphragm to filter out electrons drifting away from a focus path of electrons.

* * * * *